(12) United States Patent
Dakhiya et al.

(10) Patent No.: US 10,454,148 B2
(45) Date of Patent: Oct. 22, 2019

(54) COMPACT BAND PASS FILTER

(71) Applicant: Eagantu Ltd., Ra'anana (IL)

(72) Inventors: Michael Dakhiya, Tel Aviv (IL); Eran Shaked, Raanana (IL)

(73) Assignee: Eagantu Ltd., Ra'anana (IL)

( * ) Notice: Subject to any disclaimer, the term of this patent is extended or adjusted under 35 U.S.C. 154(b) by 0 days.

(21) Appl. No.: 15/917,120

(22) Filed: Mar. 9, 2018

(65) Prior Publication Data

US 2018/0331670 A1 Nov. 15, 2018

Related U.S. Application Data

(60) Provisional application No. 62/504,907, filed on May 11, 2017.

(51) Int. Cl.
| | |
|---|---|
| *H01P 1/203* | (2006.01) |
| *H01P 3/08* | (2006.01) |
| *H03H 7/01* | (2006.01) |
| *H03H 9/64* | (2006.01) |
| *H01P 1/207* | (2006.01) |
| *H03H 9/145* | (2006.01) |
| *H03H 9/13* | (2006.01) |

(Continued)

(52) U.S. Cl.
CPC .......... *H01P 1/20381* (2013.01); *H01P 1/207* (2013.01); *H01P 1/2088* (2013.01); *H01P 3/082* (2013.01); *H01P 5/028* (2013.01); *H03H 7/0115* (2013.01); *H03H 7/175* (2013.01); *H03H 7/1775* (2013.01); *H03H 9/0504* (2013.01); *H03H 9/058* (2013.01); *H03H 9/13* (2013.01); *H03H 9/145* (2013.01); *H03H 9/54* (2013.01); *H03H 9/6406* (2013.01)

(58) Field of Classification Search
CPC .. H01P 3/08; H01P 3/082; H01P 1/203; H01P 1/20345; H01P 1/20327; H01P 5/028
USPC .................................................. 333/204, 205
See application file for complete search history.

(56) References Cited

U.S. PATENT DOCUMENTS 2,892,163 A * 6/1959 Todd ................... H01P 1/20381
333/205
5,136,269 A 8/1992 Seitzer et al.
(Continued)

FOREIGN PATENT DOCUMENTS

| EP | 0285503 B1 | 1/1993 |
| EP | 0917233 A2 | 5/1999 |
| RU | 2460207 C2 | 8/2012 |

OTHER PUBLICATIONS

International Search Report and Written Opinion of International Searching Authority for PCT/US2018/021777, ISA/RU, Moscow, Russia, dated Jul. 23, 2018.

*Primary Examiner* — Rakesh B Patel
(74) *Attorney, Agent, or Firm* — M&B IP Analysts, LLC

(57) ABSTRACT

A compact band pass filter (BPF), including a first transmission line electromagnetically coupled to a second transmission line; and an isolating surface positioned between the first transmission line and the second transmission line, wherein the isolating surface includes at least one aperture designed to produce a desired electromagnetic coupling between the first transmission line and the second transmission line wherein the coupling produces a passband such that certain frequencies within an input transmission signal are filtered out.

16 Claims, 11 Drawing Sheets

(51) Int. Cl.
    *H03H 9/05*         (2006.01)
    *H03H 9/54*         (2006.01)
    *H01P 1/208*       (2006.01)
    *H01P 5/02*         (2006.01)

(56) References Cited

U.S. PATENT DOCUMENTS

| | | |
|---|---|---|
| 5,307,036 A | 4/1994 | Turunen et al. |
| 5,497,130 A | 3/1996 | Hirai et al. |
| 5,499,003 A | 3/1996 | Davenport |
| 5,525,942 A | 6/1996 | Horii et al. |
| 5,696,471 A | 12/1997 | Fujiwara |
| 6,215,374 B1 | 4/2001 | Petrovic |
| 6,300,850 B1 | 10/2001 | Kaegebein |
| 6,411,178 B1 | 6/2002 | Matsumura et al. |
| 6,504,451 B1 | 1/2003 | Yamaguchi |
| 7,126,444 B2 | 10/2006 | Fukunaga et al. |
| 2002/0027481 A1 | 3/2002 | Fiedziuszko |
| 2002/0093400 A1 | 7/2002 | Zhu et al. |
| 2005/0020231 A1* | 1/2005 | Yamada ............... H03D 9/0633 455/326 |
| 2008/0117003 A1 | 5/2008 | Soora |
| 2012/0249264 A1* | 10/2012 | Wakata ............... H01P 1/20345 333/185 |
| 2013/0106532 A1 | 5/2013 | Jin et al. |
| 2016/0126609 A1* | 5/2016 | Leipold ............... H01P 1/20381 333/161 |
| 2018/0115033 A1 | 4/2018 | Motoi |

* cited by examiner

COMPACT BAND PASS FILTER

CROSS-REFERENCE TO RELATED APPLICATIONS

This application claims the benefit of U.S. Provisional Application No. 62/504,907 filed on May 11, 2017, the contents of which are hereby incorporated by reference.

TECHNICAL FIELD

The present disclosure relates generally to band pass filters and, more particularly, to band pass filters having a compact size and providing minimal insertion loss with steep rejection slopes.

BACKGROUND

A band pass filter (BPF) is an electronic component that is used for filtering out unwanted frequencies for a connected device. That is, a band-pass filter allows frequencies within a certain range and rejects, or attenuates, frequencies outside that range.

For example, FIG. 1 shows a graph of frequencies passing through an ideal BPF. The bandwidth that is permitted to pass though, i.e., the passband as indicated on the graph, is the range of frequencies that extends from a minimum frequency of $f_1$ to a maximum frequency of $f_2$. The amplitude of the passband, as shown on the vertical axis of the graph, is measured in decibels and indicates the amount of insertion loss, or loss of signal, of the transmitted frequency. An ideal BPF contains zero insertion loss.

The graph indicates a perfectly vertical rejection curve, which allows all of the desired frequencies, or the passbands, to successfully pass through the filter while preventing all of the unwanted frequencies, or the stopbands, from passing through. A perfectly ideal vertical curve creates a distinct cut off point between the stopbands and the passband.

The requirements of a desirable BPF include both a low insertion loss and a steep rejection curve. However, unlike an ideal BPF, an actual BPF is unable to create a perfectly vertical rejection curve or zero insertion loss. FIG. 2 shows a graph of frequencies of an actual, non-ideal, BPF. The rejection curve is shallow, both between the minimum frequency and the passband and the maximum frequency and the passband. Additionally, there is insertion loss of allowed frequencies within the passband, e.g., 3 decibels.

Many currently available BPFs employ one or more resonators having resonance of certain frequencies. Signals with frequencies close to the resonant frequencies pass through the filter, while signals farther away are blocked. In the related art, three main designs of current resonators include: (a) resonators based on capacitors and inductors; (b) resonators based on surface and bulk acoustic wave filters (known as SAW and BAW filters); and (c) resonators based on a cavity in a dielectric material.

FIG. 3A shows a diagram of an LC resonator-based BPF using several connected inductors (L1, L2, L3 and L8) and capacitors (C1, C2, C3, C8, and C9). Connected components C1 and L1 and other similar capacitors and inductors are the basic components of LC-resonators. These BPFs often employ multiple LC-resonators that are coupled together, as one resonator is usually insufficient to provide the required or desired rejection curve steepness. Thus, several consecutive and connected resonators are often used together. However, as illustrated in the graph shown in FIG. 3B, the rejection curve produced by such resonators is shallow, resulting in a gradual transition between the stopband and the passband, permitting some unwanted frequencies to pass through while also blocking some desired frequencies, resulting in an inaccurate BPF.

FIGS. 4A and 4B show a SAW and a BAW type of BPF, respectively. These filters are popular designs used in modern wireless communication devices due to their high rejection rate of unwanted frequencies (~30-50 dB in proximity of ~50 MHz to the passband). Namely, they produce, as shown in FIG. 4C, a steep rejection curve. However, the insertion loss created by SAW and BAW filters is often undesirably high. Further, additional limitation exists. Specifically, SAW type filters are only effective for frequencies of up to ~3.5 GHz, but are not available for higher frequency bands that are currently in development for many mobile devices (e.g., 6 GHz, 28 GHz, etc.). Further, BAW type filters can be very expensive to produce and are likewise not effective for the 28 GHz band. Additionally, the passband created by SAW and BAW types of BPF is relatively narrow (between 70 MHz-100 MHz or similar) and cannot be adjusted.

The third type of BPF is based on a cavity in a dielectric material, as shown in FIG. 5A. These filters allow for both a steep rejection curve and low insertion losses. However, due to the physical structure required for optimal performance, such filters are large in size. Evidently, as demonstrated in FIG. 5B, the third type of BPF are often too big for use in many applications, such as smartphones, tablets, wearables, and the like.

In addition to the physical size, the narrow bandwidth is a limiting factor for using a conventional BPF in mobile telephones or smartphones. A mobile telephone should operate in the entire frequency band of radio frequency (RF) signals designed to be transmitted and received by the telephone. In modern communication standards, the frequency band (bandwidth) of mobile (cellular) telephones may include a wide range of frequency. Typically, such a frequency range is between 1 GHz and 7 GHz while operating at a multi-band frequency. As discussed above, conventional BPFs cannot meet this demand. In addition, the insertion loss causes poor transmission and reception of RF signals. Thus, a smaller version of a BPF with low insertion loss, wide passbands, and steep rejections curves is desirable.

It would therefore be advantageous to provide a BPF that would overcome the limitations noted above.

SUMMARY

A summary of several example embodiments of the disclosure follows. This summary is provided for the convenience of the reader to provide a basic understanding of such embodiments and does not wholly define the breadth of the disclosure. This summary is not an extensive overview of all contemplated embodiments, and is intended to neither identify key or critical elements of all embodiments nor to delineate the scope of any or all aspects. Its sole purpose is to present some concepts of one or more embodiments in a simplified form as a prelude to the more detailed description that is presented later. For convenience, the term "certain embodiments" may be used herein to refer to a single embodiment or multiple embodiments of the disclosure.

Certain embodiments disclosed herein include a compact band pass filter (BPF), including a first transmission line electromagnetically coupled to a second transmission line; and an isolating surface positioned between the first transmission line and the second transmission line, wherein the isolating surface includes at least one aperture designed to produce a desired electromagnetic coupling between the first transmission line and the second transmission line wherein the coupling produces a passband such that certain frequencies within an input transmission signal are filtered out.

Certain embodiments disclosed herein also include a compact band pass filter (BPF), including a first transmission line; and a second transmission line, wherein the first transmission line electromagnetically coupled to the second transmission line, wherein the coupling produces a passband such that certain frequencies within an input transmission signal are filtered out.

BRIEF DESCRIPTION OF THE DRAWINGS

The subject matter disclosed herein is particularly pointed out and distinctly claimed in the claims at the conclusion of the specification. The foregoing and other objects, features, and advantages of the disclosed embodiments will be apparent from the following detailed description taken in conjunction with the accompanying drawings.

DETAILED DESCRIPTION

Figure 1:
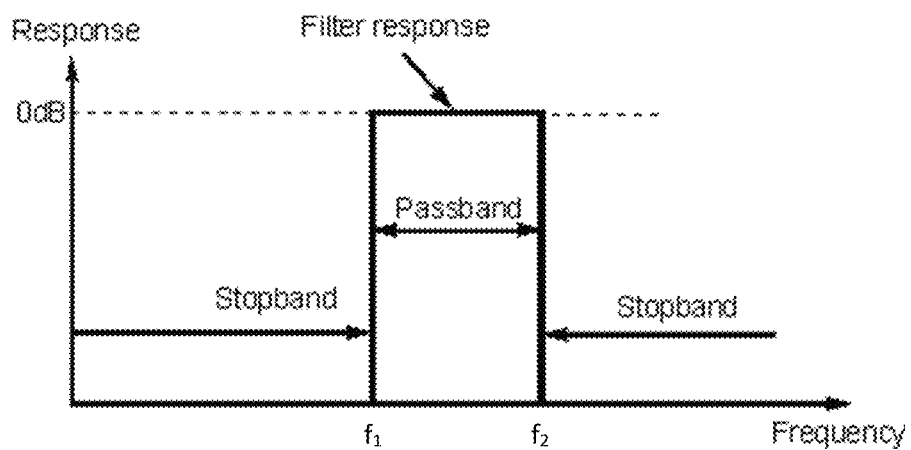
FIG. 1 is a graph of frequencies passing through an ideal band pass filter.
Figure 2:
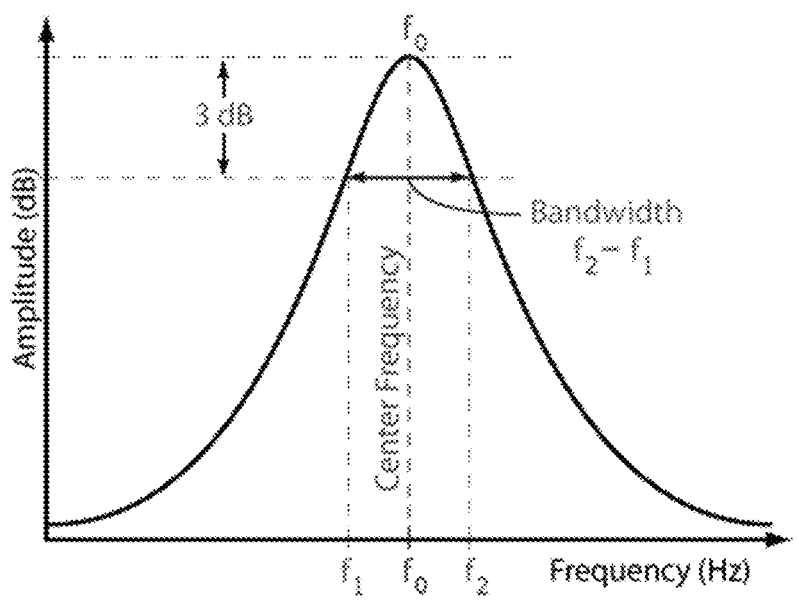
FIG. 2 is a graph of frequencies passing through an example of a non-ideal band pass filter.
Figure 3A:
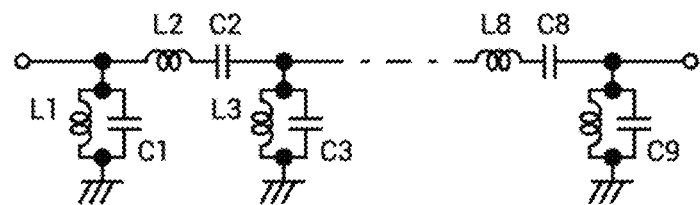
FIG. 3A is an example diagram of an LC resonator band pass filter.
Figure 3B:
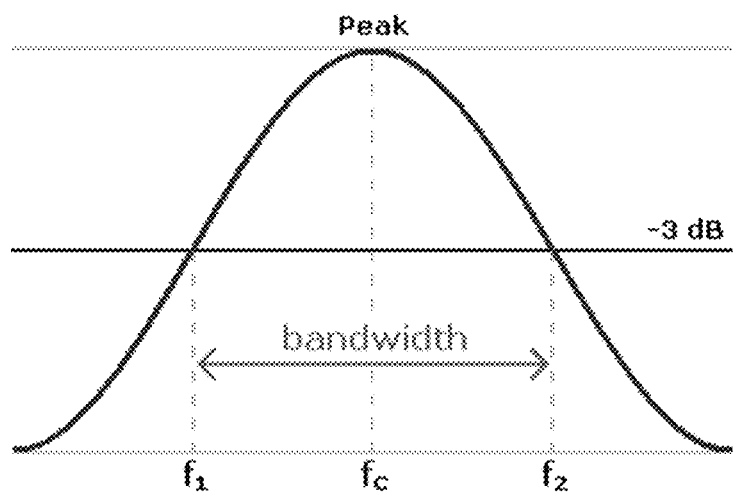
FIG. 3B is a graph of frequencies passing through an example non-ideal LC band pass filter.
Figure 4A:
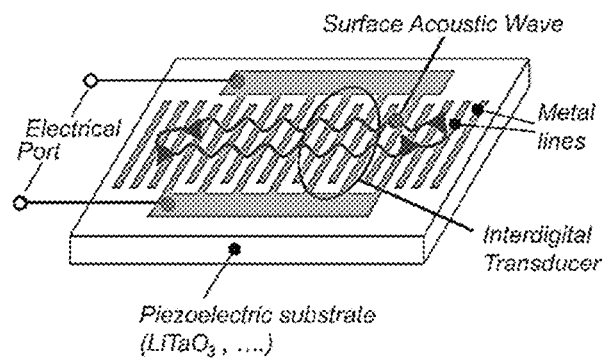
FIG. 4A is an example diagram of a surface acoustic wave band pass filter.
Figure 4B:
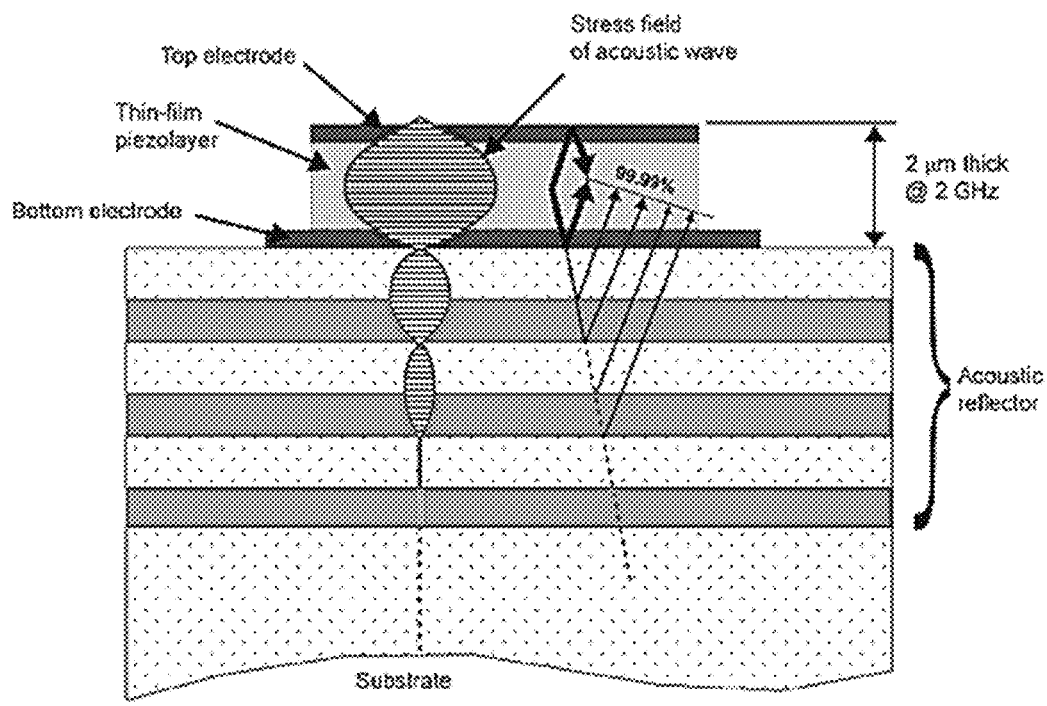
FIG. 4B is an example diagram of a bulk acoustic wave band pass filter.
Figure 4C:
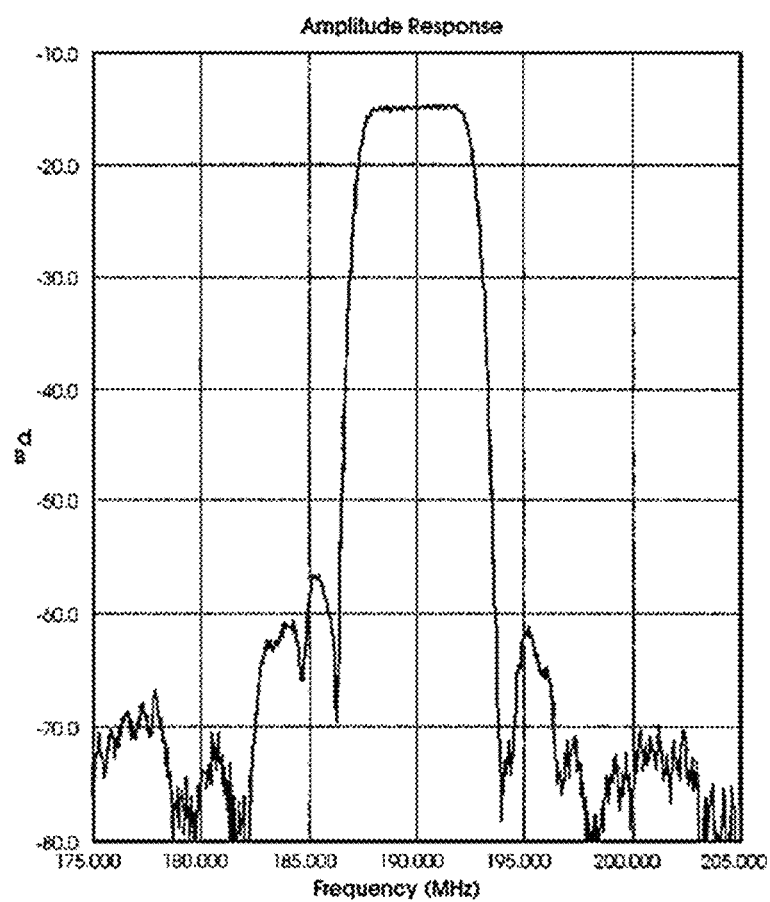
FIG. 4C is a graph of frequencies passing through an example acoustic wave band pass filter.
Figure 5A:
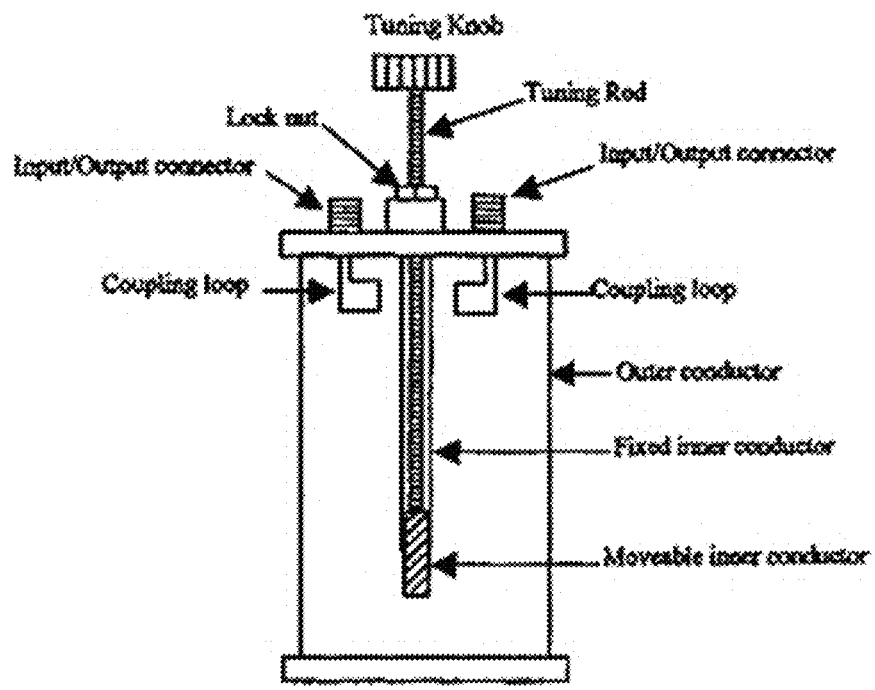
FIG. 5A is an example diagram of a cavity-based band pass filter.
Figure 5B:
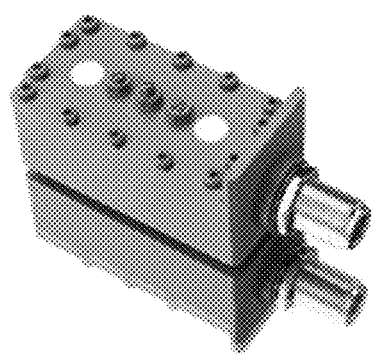
FIG. 5B is an example of a cavity-based band pass filter according to an embodiment.

It is important to note that the embodiments disclosed herein are only examples of the many advantageous uses of the innovative teachings herein. In general, statements made in the specification of the present application do not necessarily limit any of the various claimed embodiments. Moreover, some statements may apply to some inventive features but not to others. In general, unless otherwise indicated, singular elements may be in plural and vice versa with no loss of generality. In the drawings, like numerals refer to like parts through several views.

Some example embodiments disclosed herein include a band pass filter (BPF) designed to limit the bandwidth of incoming frequencies with step rejection curves, low insertion loss, and small physical dimensions. The BPF disclosed herein can be integrated in hand-held devices such as, but not limited to, a mobile telephone, a smartphone, a tablet computer, a laptop computer, a wearable electronic device, and the like. The BPF can also be integrated in other communication devices, such as radars (e.g., for autonomous car), base-stations, routers, and so on. The proposed design is based on placing isolating surfaces between electromagnetically coupled transmission lines, where the isolating surfaces include apertures used to control the properties of the passband and stopband frequencies. According to the disclosed embodiments, the disclosed BPF can operate at a multi-band frequency between a frequency band of 1 GHz and 32 GHz.

Figure 6A:
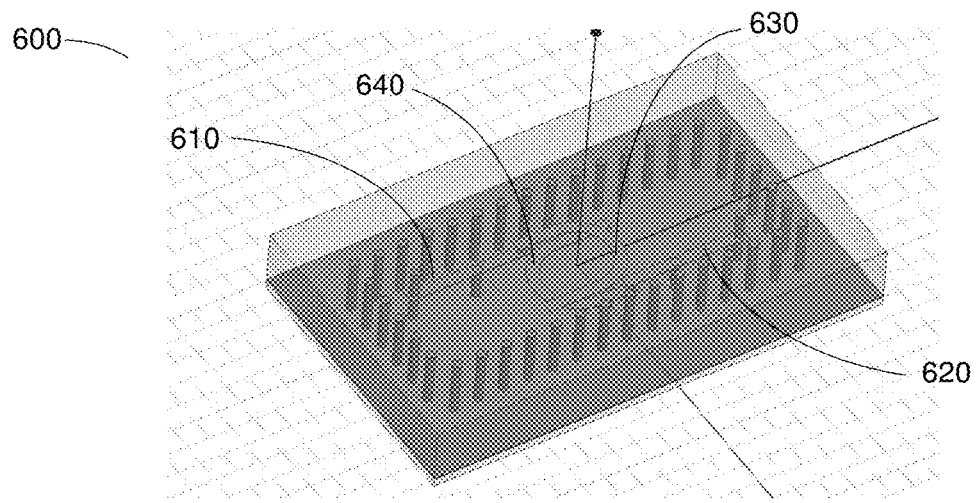
FIG. 6A is an electromagnetically coupled band pass filter according to an embodiment.

FIG. 6A shows an example band pass filter (BPF) 600 designed according to an embodiment. The BPF 600 employs a resonator to filter unwanted frequencies. A resonator is a device that naturally oscillates at certain frequencies with greater amplitude than at others. A basic form of a resonator as employed as a BPF includes a transmission line having a length equal to half of the electromagnetic wavelength of the frequency desired to be allowed to pass through. Certain resonators include multiple transmission lines of one or more lengths.

As shown in FIG. 6A, two conductive transmission lines 610 and 620 are placed in close proximity such that they are electrically coupled to form a resonator. Thus, frequencies that resonate with both of the transmission lines will be filtered through the BPF 600. In order to reduce the physical size of the BPF 600, the transmission lines 610 and 620 can be configured in various shapes other than a straight line.

In the example embodiment illustrated in FIG. 6, the first transmission line 610 includes a U-shaped 630 portion positioned directly above a U-shaped portion 640 of the second transmission line 620. In an embodiment, an incoming RF signal is received by the first transmission line 610 and communicated to the second transmission line 620 via electromagnetic coupling along the respective U-shaped portions 630, 640. The received signal is filtered based on the resonant frequencies, and an output signal includes the passband frequencies while attenuating stopband frequencies.

Figure 6B:
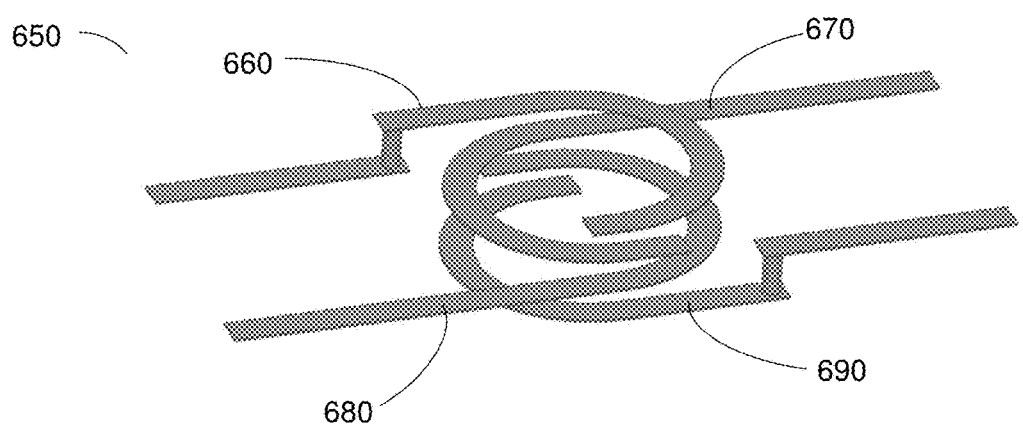
FIG. 6B is an example resonator of a band pass filter including multiple transmission lines according to an embodiment.

FIG. 6B is an example resonator of a BPF 650 including multiple transmission lines according to an embodiment. A first transmission line 660 includes a U-shaped portion aligned with a U-shaped portion of a second transmission line 670. Namely, the U-shaped portion of the first transmission line 660 is placed above an opposingly positioned U-shaped portion of the second transmission line 670, which is placed above an opposingly positioned U-shaped portion of a third transmission line 680, which is subsequently placed above an opposingly positioned U-shaped portion of a fourth transmission line 690.

In an embodiment of the BPF 650, the first transmission line 660 receives an incoming RF signal, and the fourth transmission line 690 outputs a filtered output signal. In an example embodiment, the radius of the U-shaped portion of each of the transmission lines is approximately 790 microns, the line thickness of each of the transmission lines is approximately 17 microns, and the distance between the U-shaped portion of adjacent transmission lines is approximately 350 microns. Such an example design provides a BPF with a passband of approximately 5.9-6.5 GHz.

Figure 7A:
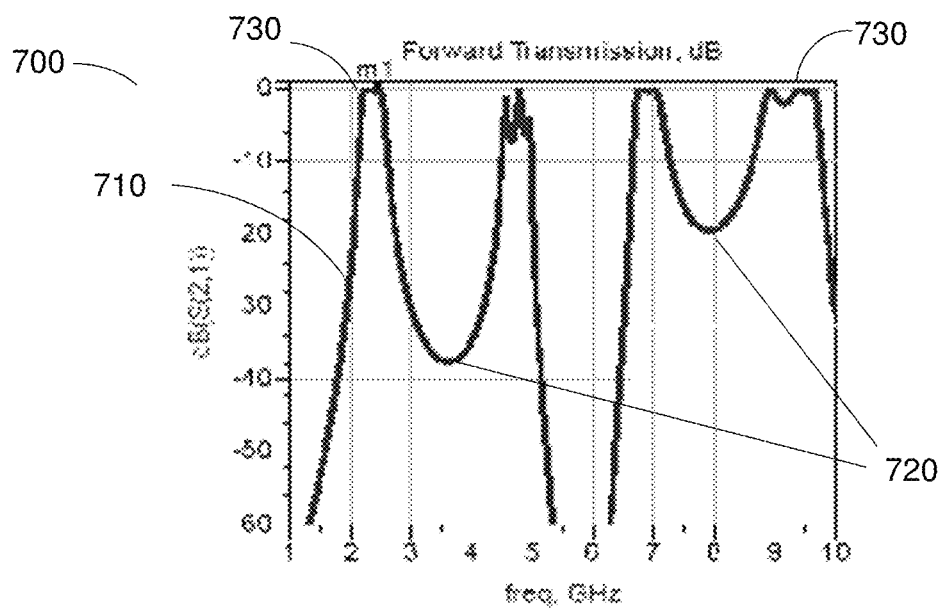
FIG. 7A is a graph of frequencies of a band pass filter demonstrating an example of the effects of parasitic coupling.

It should be noted that employing two or more electrically coupled transmission lines as part of a BPF can cause parasitic coupling, where different resonant frequencies interfere to reduce the bandwidth of the passband or introduce insertion loss therein. As demonstrated in FIG. 7A, a steep rejection curve 710 leads to a peak 730 of the passband, but increased insertion noise 720 is introduced due to interference caused by nearby transmission lines. Thus, the BPF attenuates not only the stopband frequencies, but additional frequencies within the passband as well. When implemented on a communication device, such a BPF will cause signal loss and potential communication failure.

Figure 7B:
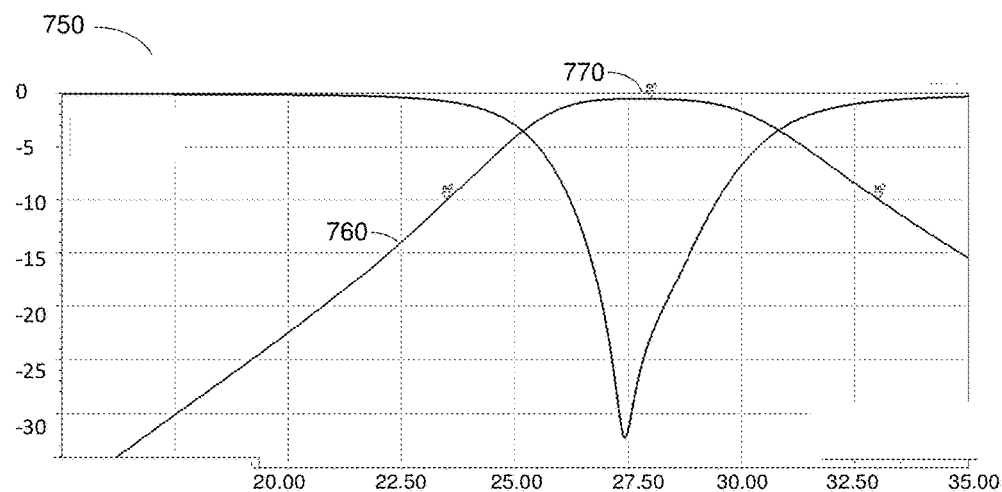
FIG. 7B is a graph of frequencies of a band pass filter with strong electromagnetic coupling.

FIG. 7B is a graph 750 of frequencies of a BPF having strong electromagnetic coupling. As a general rule, a strong coupling between transmission lines provides a filter with non-steep rejection curves, e.g., the curve 760, and minimal insertion loss, e.g., the insertion loss of the passband 770 of less than 1 dB of signal loss.

Figure 7C:
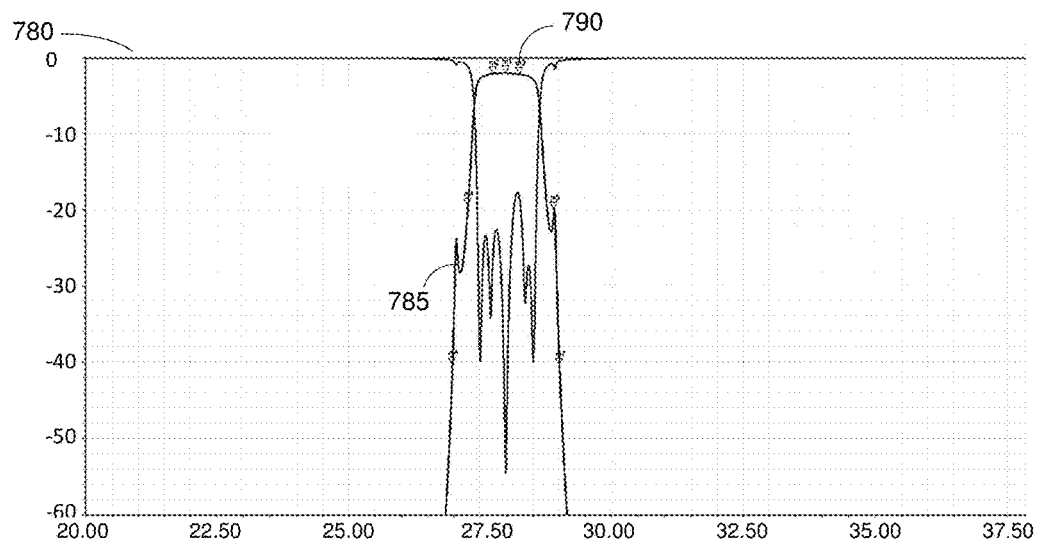
FIG. 7C is a graph of frequencies of a band pass filter with weak electromagnetic coupling.

Alternatively, as shown in the graph 780 of FIG. 7C, a weak coupling between transmission lines provides a filter with a steeper rejection curve, e.g., the curve 785, but with increased insertion loss, e.g., the loss of 2 dB within the passband.

According to the disclosed embodiments, in order to minimize parasitic coupling and better control the properties of the passband, additional isolating surfaces, such as electrically conductive (metal) materials, are introduced between the coupled transmission lines, e.g., between transmission lines 610, 620 of FIG. 6A and between transmission lines 660, 670, 680, and 690 of FIG. 6B. Such a surface partially isolates the transmission lines and reduces unwanted interference introduced by parasitic coupling. Additionally, the use of isolating surfaces enables the placement of multiple transmission lines in close proximity of each other with minimal or no parasitic coupling, allowing for a physically compact BPF. In an embodiment, the isolating surface or surfaces include an aperture configured to control electromagnetic coupling and the resulting passband. The size and shape of the aperture, as well as its position on the isolating surface with respect to the transmission lines, can vary. Adjustment of these properties allow for precise coupling control.

Figure 8:
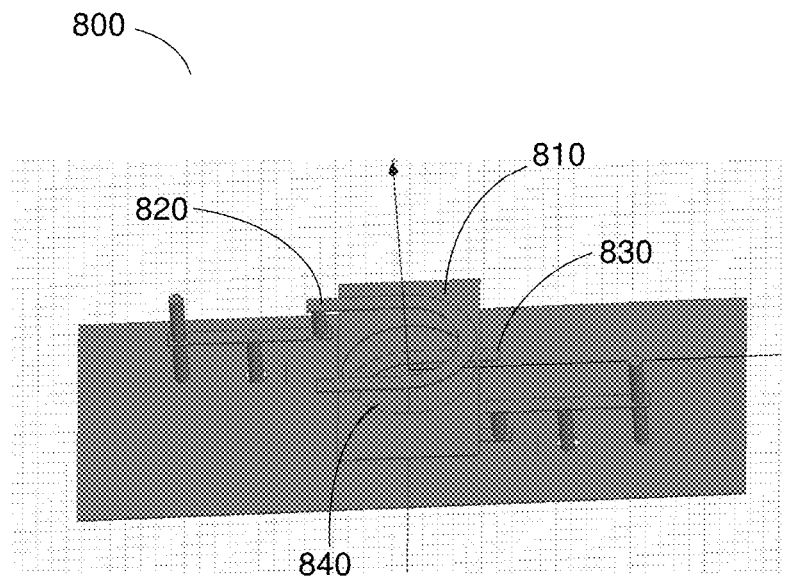
FIG. 8 is a band pass filter with an isolating surface between two transmission lines according to an embodiment.

FIG. 8 shows an example embodiment of a BPF 800 with an isolating surface 810 placed between two transmission lines 820 and 830. The isolating surface 810 includes an aperture 840 coaxially placed in between the center points of the U-shaped portions of the transmission lines 820 and 830. The isolating surface 840 prevents undesired interference between the transmission lines 820 and 830. It should be noted that the number of layers of isolating surfaces within the BPF is not limited to two.

Figure 9:
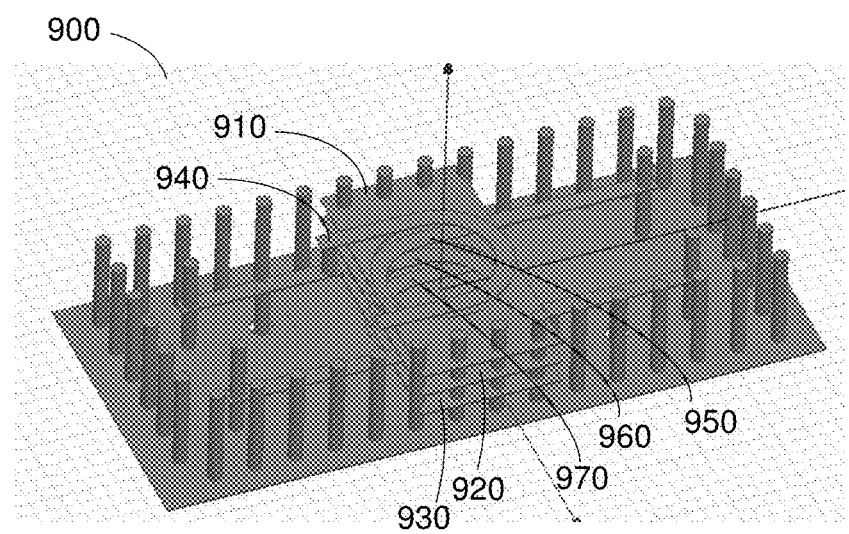
FIG. 9 is a band pass filter with multiple isolating surfaces between multiple transmission lines, according to an embodiment.

As shown in FIG. 9, multiple isolating surfaces 910, 920 and 930 are placed alternately between multiple transmission lines 940, 950 and 960 of a BPF 900. In the disclosed embodiments, each of the transmission lines 940, 950, 960 and 970 are in the form of a U-shape, with alternating directions, and each of the multiple isolating surfaces 910, 920 and 930 include a central circular aperture aligned with the transmission lines' central positioning. When implanted within the BPF 900, the isolating surfaces 910, 920 and 930 allow the transmission lines 940, 950, 960 and 970 to be positioned very close together while maintaining minimal parasitic coupling, allowing for a compact BPF 900 as previously discussed.

In an embodiment, an incoming RF signal is received by the first transmission line 940 and relayed to the second transmission line 950 electromagnetically coupled thereto, where the transmission of the signal is influenced by the first isolating surface 910. Next, the signal is relayed to the electromagnetically coupled third transmission line 960, where the signal is further influenced by the second isolating surface 920. The signal is finally relayed to the fourth transmission line 970 after being influenced by the third isolating surface 930. Each transmission between lines and isolating surfaces affect the resulting output signal, and more specifically alter the shape of the stopbands and passband.

Figure 10:
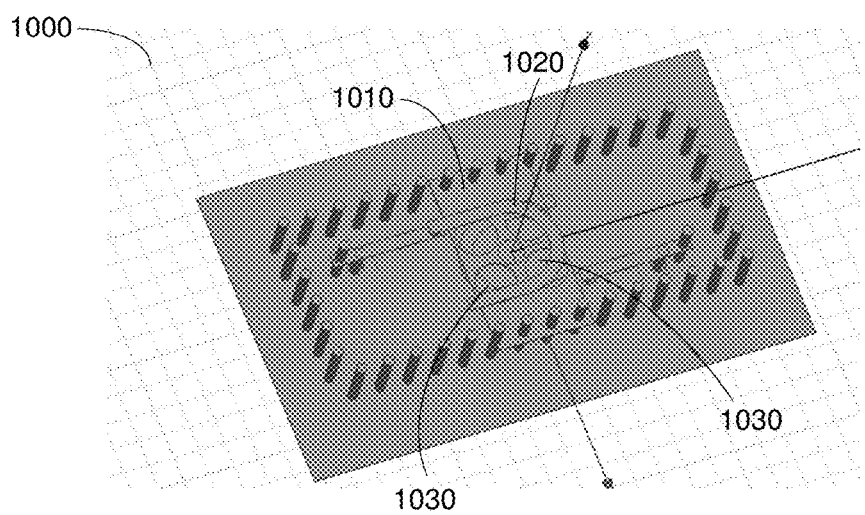
FIG. 10 is a band pass filter having an isolating surface with multiple apertures according to an embodiment.

FIG. 10 shows an alternative embodiment of a BPF 1000 where the isolating surface 1010 contains multiple apertures 1030. In this example embodiment, the isolating surface 1010 contains five circular apertures, with a central aperture having a smaller dimension than four surrounding apertures. Adjusting the shape and position of the one or more apertures allows for adjustments of the resulting passband output by the BPF 1000.

Figure 11A:
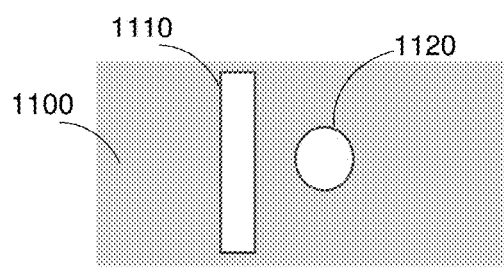
FIGS. 11A and 11B are diagrams of example isolating surfaces with asymmetrical apertures according to an embodiment.
Figure 11B:
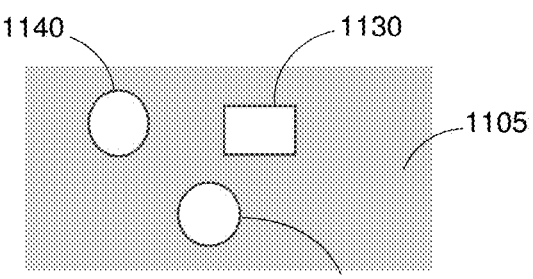

The apertures 1030 may be symmetrically structured, as shown in FIG. 10, or may include asymmetrical positioning, as shown in FIGS. 11A and 11B. FIG. 11A shows an example isolating surface 1110 containing an elongated rectangular aperture 1110 and a central circular aperture 1120. In an alternate configuration shown in FIG. 11B, a rectangular aperture 1130 and two circular apertures 1140, are placed on an isolating surface 1105, where none of the apertures is centrally located thereon. Various isolating surfaces with multiple symmetrical or asymmetrical apertures may be alternatingly stacked in between multiple transmission lines.

It should be noted that the resulting filtering curve caused by asymmetrical apertures within an isolating surface are not symmetrical with respect to the left and right rejection slopes, which may have differing sloping values. The properties of the stopbands and passbands may be manipulated based on the placement and stacking of the isolating surfaces.

In an embodiment, proper placement of isolating surfaces allows for effective separation of closely adjacent frequency bands. Specifically, stacking multiple non-identical isolating surfaces, e.g., isolating surfaces having various non-identical apertures, enables an asymmetrical filter response. In an embodiment, stacking asymmetrical isolating surface between transmission lines allows for a steep rejection curve on at least one side of the passband-stopband interface.

Figure 12A:
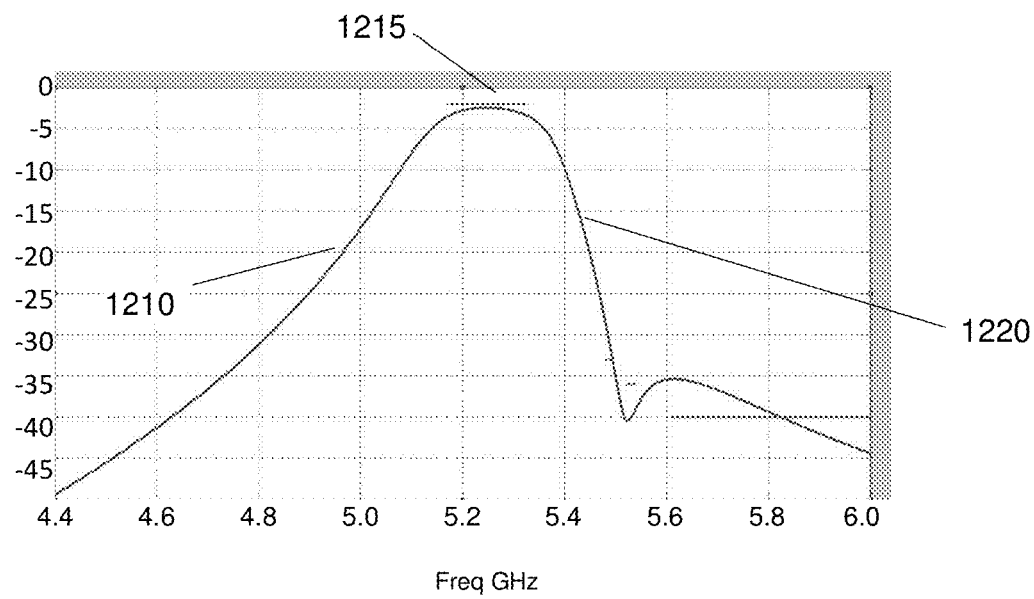
FIGS. 12A and 12B are graphs displaying frequencies of a band pass filter with isolating surfaces having asymmetrical apertures, according to an embodiment.
Figure 12B:
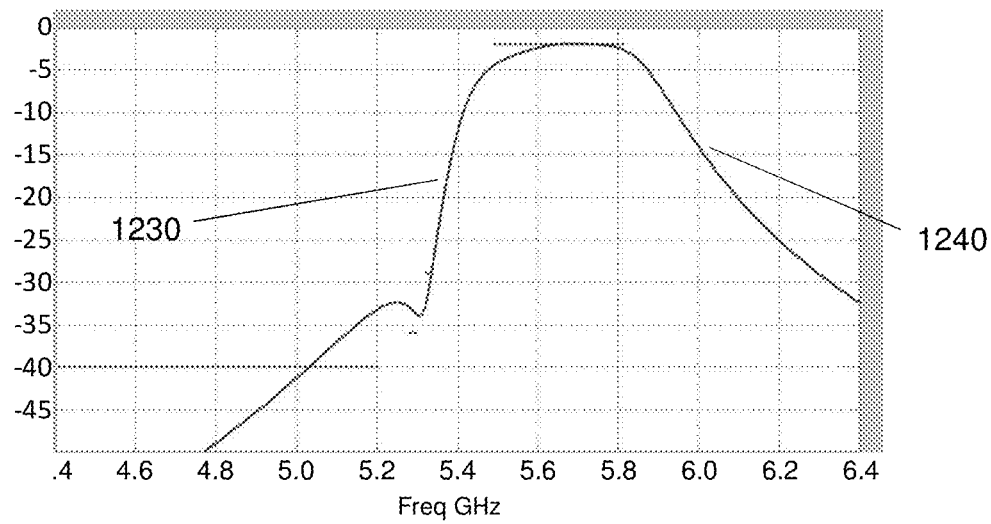

FIGS. 12A and 12B show example graphs of frequencies having various sloped rejection curves cause by asymmetrical isolating surfaces within a BPF designed according to the various disclosed embodiments. FIG. 12A shows a shallow left rejection curve 1210 as the stopband transitions into the passband 1215. However, the right rejection curve 1220 is significantly steeper, with a sharper transition between the passband and the stopband. Likewise, FIG. 12B shows a steep left rejection curve 1230 and a shallow right rejection curve 1240.

As used herein, the phrase "at least one of" followed by a listing of items means that any of the listed items can be utilized individually, or any combination of two or more of the listed items can be utilized. For example, if a system is described as including "at least one of A, B, and C," the system can include A alone; B alone; C alone; A and B in combination; B and C in combination; A and C in combination; or A, B, and C in combination.

All examples and conditional language recited herein are intended for pedagogical purposes to aid the reader in understanding the principles of the disclosed embodiment and the concepts contributed by the inventor to furthering the art, and are to be construed as being without limitation to such specifically recited examples and conditions. Moreover, all statements herein reciting principles, aspects, and embodiments of the disclosed embodiments, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure.

What is claimed is:

1. A compact band pass filter (BPF), comprising:
   a first transmission line electromagnetically coupled to a second transmission line; and
   an isolating surface positioned between the first transmission line and the second transmission line, wherein the isolating surface includes at least one aperture designed to produce a desired electromagnetic coupling between the first transmission line and the second transmission line, wherein the coupling produces a passband such that certain frequencies within an input transmission signal are filtered out, and wherein the isolating surface further includes at least one asymmetrical aperture that is asymmetrical with respect to the first transmission line and the second transmission line.

2. The BPF of claim 1, wherein an operating frequency of the BPF is between 1 gigahertz (GHz) and 32 GHz, wherein the operating frequency of the BPF includes a plurality of distinct frequency bands.

3. The BPF of claim 1, wherein a placement of the at least one aperture within the isolating surface defines a steep rejection curve between the passband and a stopband of the BPF.

4. The BPF of claim 1, wherein the first transmission line and the second transmission line each further include a U-shaped portion.

5. The BPF of claim 4, wherein the U-shaped portion of the first transmission line is aligned with the U-shaped portion of the second transmission line.

6. The BPF of claim 4, wherein the U-shaped portion of the first transmission line and the U-shaped portion of the second transmission line are alternating in direction.

7. The BPF of claim 1, further including at least one intermediate transmission line placed in between the first transmission line and the second transmission line.

8. The BPF of claim 7, further including at least one intermediate isolating surface such that the at least one intermediate isolating surface or the isolating surface is positioned between adjacent transmission lines within the BPF.

9. The BPF of claim 8, wherein each of the at least one intermediate isolating surfaces includes an aperture therein.

10. The BPF of claim 9, wherein the at least one aperture of the isolating surface and each of the apertures of the at least one intermediate isolating surfaces are asymmetrical with respect to each other.

11. The BPF of claim 1, wherein the at least one aperture within the isolating surface comprises at least one of the following shapes: a circle, a square, a rectangle, and an ellipse.

12. A compact band pass filter (BPF), comprising:
    a first transmission line; and
    a second transmission line, wherein the first transmission line is electromagnetically coupled to the second transmission line, wherein the coupling produces a passband such that certain frequencies within an input transmission signal are filtered out;
    wherein the first transmission line and the second transmission line each further include a U-shaped portion, wherein the U-shaped portion of the first transmission line and the U-shaped portion of the second transmission line are aligned with one another and are alternating in direction.

13. The BPF of claim 12, further comprising:
    at least one intermediate transmission line placed in between the first transmission line and the second transmission line.

14. The BPF of claim 12, wherein a placement of the first transmission line and the second transmission line is configured to produce at least one steep rejection curve between the passband and a stopband of the BPF.

15. The BPF of claim 12, wherein an operating frequency of the BPF is between 1 gigahertz (GHz) and 32 GHz, wherein the operating frequency of the BPF includes a plurality of distinct frequency bands.

16. The BPF of claim 12, wherein the BPF is integrated in a handheld electronic device.

* * * * *